(12) United States Patent
Datta et al.

(10) Patent No.: US 9,425,256 B2
(45) Date of Patent: Aug. 23, 2016

(54) STRAIN INDUCING SEMICONDUCTOR REGIONS

(71) Applicant: Intel Corporation, Santa Clara, CA (US)

(72) Inventors: Suman Datta, Beaverton, OR (US); Jack T. Kavalieros, Portland, OR (US); Been-Yih Jin, Taiwan (CN)

(73) Assignee: Intel Corporation, Santa Clara, CA (US)

( * ) Notice: Subject to any disclaimer, the term of this patent is extended or adjusted under 35 U.S.C. 154(b) by 172 days.

(21) Appl. No.: 14/133,457

(22) Filed: Dec. 18, 2013

(65) Prior Publication Data

US 2014/0103396 A1    Apr. 17, 2014

Related U.S. Application Data

(60) Continuation of application No. 13/971,716, filed on Aug. 20, 2013, now Pat. No. 8,841,180, which is a continuation of application No. 13/160,886, filed on Jun. 15, 2011, now Pat. No. 8,530,884, which is a continuation of application No. 12/898,211, filed on Oct. 5, 2010, now Pat. No. 8,421,059, which is a division of application No. 11/450,745, filed on Jun. 9, 2006, now Pat. No. 7,825,400.

(51) Int. Cl.
*H01L 29/12* (2006.01)
*H01L 29/10* (2006.01)
(Continued)

(52) U.S. Cl.
CPC ....... *H01L 29/1033* (2013.01); *H01L 29/0673* (2013.01); *H01L 29/201* (2013.01); *H01L 29/205* (2013.01); *H01L 29/41725* (2013.01); *H01L 29/66431* (2013.01); *H01L 29/66628* (2013.01); *H01L 29/66636* (2013.01); *H01L 29/66787* (2013.01); *H01L 29/775* (2013.01); *H01L 29/78* (2013.01); *H01L 29/785* (2013.01); *H01L 29/66545* (2013.01)

(58) Field of Classification Search
CPC ... H01L 29/201; H01L 29/205; H01L 29/78; H01L 29/1033; H01L 29/0673; H01L 29/6431; H01L 29/66628; H01L 29/66636; H01L 29/785; H01L 29/66787
USPC .......................................... 438/187; 257/192
See application file for complete search history.

(56) References Cited

U.S. PATENT DOCUMENTS 5,475,244 A * 12/1995 Koizumi et al. .............. 257/192
6,621,131 B2    9/2003 Murthy et al.
(Continued)

OTHER PUBLICATIONS

Final Office Action from U.S. Appl. No. 11/450,745, mailed Aug. 4, 2009, 9 pgs.
(Continued)

*Primary Examiner* — Yosef Gebreyesus
(74) *Attorney, Agent, or Firm* — Green, Howard & Mughal, LLP (57) ABSTRACT

A method to form a strain-inducing semiconductor region is described. In one embodiment, formation of a strain-inducing semiconductor region laterally adjacent to a crystalline substrate results in a uniaxial strain imparted to the crystalline substrate, providing a strained crystalline substrate. In another embodiment, a semiconductor region with a crystalline lattice of one or more species of charge-neutral lattice-forming atoms imparts a strain to a crystalline substrate, wherein the lattice constant of the semiconductor region is different from that of the crystalline substrate, and wherein all species of charge-neutral lattice-forming atoms of the semiconductor region are contained in the crystalline substrate.

9 Claims, 12 Drawing Sheets

(51) Int. Cl.
*H01L 29/201* (2006.01)
*H01L 29/205* (2006.01)
*H01L 29/78* (2006.01)
*H01L 29/417* (2006.01)
*H01L 29/775* (2006.01)
*H01L 29/06* (2006.01)
*H01L 29/66* (2006.01)

(56) References Cited

U.S. PATENT DOCUMENTS

| | | | |
|---|---|---|---|
| 6,861,318 B2 | 3/2005 | Murthy et al. | |
| 6,885,084 B2 | 4/2005 | Murthy et al. | |
| 6,909,151 B2 | 6/2005 | Hareland et al. | |
| 6,960,781 B2 | 11/2005 | Currie et al. | |
| 6,974,738 B2 | 12/2005 | Hareland et al. | |
| 7,145,167 B1* | 12/2006 | Chu | H01L 21/823807 257/18 |
| 7,504,704 B2* | 3/2009 | Currie | H01L 21/76224 257/19 |
| 2006/0093010 A1 | 5/2006 | Sekiya et al. | |
| 2006/0205167 A1* | 9/2006 | Kavalieros | H01L 21/823807 438/300 |
| 2007/0122954 A1* | 5/2007 | Liu et al. | 438/187 |
| 2007/0128782 A1 | 6/2007 | Liu et al. | |

OTHER PUBLICATIONS

Non-Final Office Action from U.S. Appl. No. 11/450,745, mailed Jan. 4, 2010, 8 pgs.
Non-Final Office Action from U.S. Appl. No. 11/450,745 mailed Feb. 12, 2008, 11 pgs.
Final Office Action from U.S. Appl. No. 11/450,745, mailed Aug. 25, 2008, 10 pgs.
Non-Final Office Action from U.S. Appl. No. 11/450,745, mailed Jan. 26, 2009, 8 pgs.
Office Action from U.S. Appl. No. 12/898,211 mailed Jun. 6, 2012, 10 pgs.
Non-Final Office Action from U.S. Appl. No. 13/160,886 mailed Sep. 14, 2012, 11 pgs.
Non-Final Office Action from U.S. Appl. No. 13/971,716 mailed Dec. 19, 2013, 9 pgs.

* cited by examiner

PRIOR ART

FIG. 2C

PRIOR ART

STRAIN INDUCING SEMICONDUCTOR REGIONS

CROSS-REFERENCE TO RELATED APPLICATIONS

This application is a continuation of U.S. patent application Ser. No. 13/971,716, filed Aug. 20, 2013, which is a continuation of U.S. patent application Ser. No. 13/160,886, filed Jun. 15, 2011, now U.S. Pat. No. 8,530,884, issued Sep. 10, 2013, which is a continuation of U.S. patent application Ser. No. 12/898,211, filed Oct. 5, 2010, now U.S. Pat. No. 8,421,059, issued Apr. 16, 2013, which is a divisional of U.S. patent application Ser. No. 11/450,745, filed Jun. 9, 2006, now U.S. Pat. No. 7,825,400, issued Nov. 2, 2010, the entire contents of which are hereby incorporated by reference herein.

BACKGROUND OF THE INVENTION

1) Field of the Invention

The invention is in the field of Semiconductor Devices.

2) Description of Related Art

For the past several years, the performance of semiconductor devices, such as Metal Oxide Semiconductor Field-Effect Transistors (MOS-FETs), has been greatly enhanced by the incorporation of strained silicon regions into the active portions of a semiconductor substrate, e.g. the use of compressively strained silicon channel regions to enhance hole mobility in P-type Metal Oxide Semiconductor Field-Effect Transistors (PMOS-FETs). The presence of such strained silicon regions may greatly enhance the rate at which charge migrates in a channel when a semiconductor is in an ON state.

Figure 1:
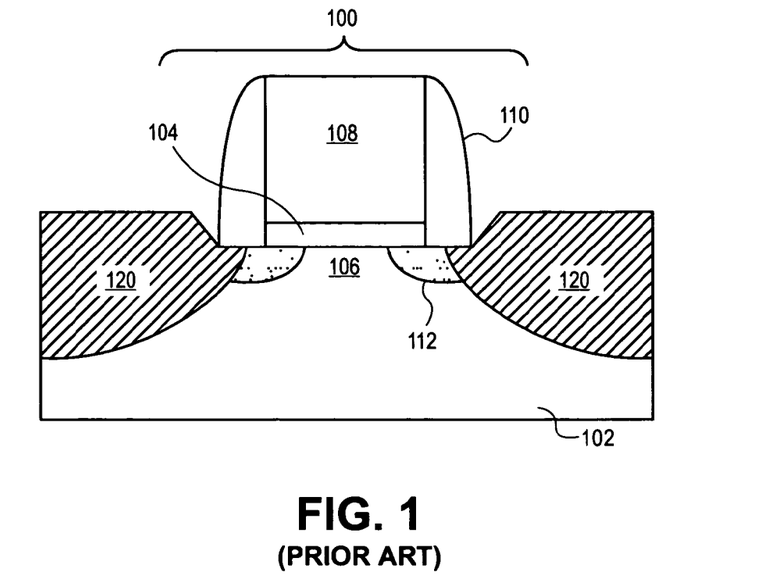
FIG. 1 illustrates a cross-sectional view of a strained P-type Metal Oxide Semiconductor Field-Effect Transistor (PMOS-FET), in accordance with the prior art.

FIG. 1 depicts a typical strained PMOS-FET 100 fabricated on a substrate 102. A gate dielectric layer 104 sits above a channel region 106 and a gate electrode 108 sits above gate dielectric layer 104. Gate dielectric layer 104 and gate electrode 108 are isolated by gate isolation spacers 110. Tip extensions 112 are formed by implanting dopant atoms into substrate 102. Strain-inducing source/drain regions 120 are formed by selectively growing an epitaxial film in etched-out portions of substrate 102 and are doped either in situ or after epitaxial film growth, or both. In typical PMOS-FETs, the channel region 106 is comprised of crystalline silicon, while the strain-inducing source/drain regions 120 are comprised of epitaxial silicon/germanium which has a larger lattice constant than that of crystalline silicon. Strain-inducing source/drain regions 120 can impart a uniaxial compressive strain to the channel region 106. Such a compressive strain can enhance the hole mobility in channel region 106 of PMOS-FET 100, lending to improved performance of the device.

Figure 2A:
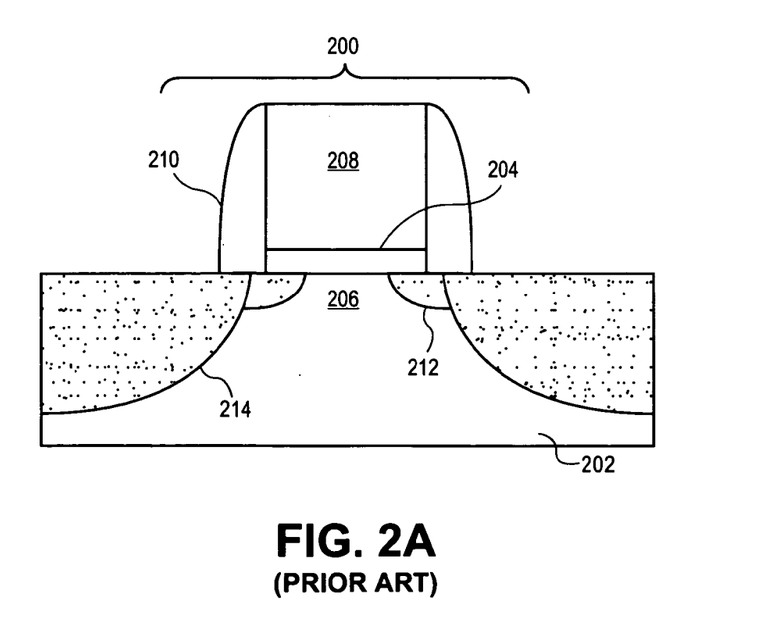
FIGS. 2A-C illustrate cross-sectional views representing the formation of a PMOS-FET device with strain-inducing silicon/germanium source/drain regions, in accordance with the prior art.
Figure 2B:
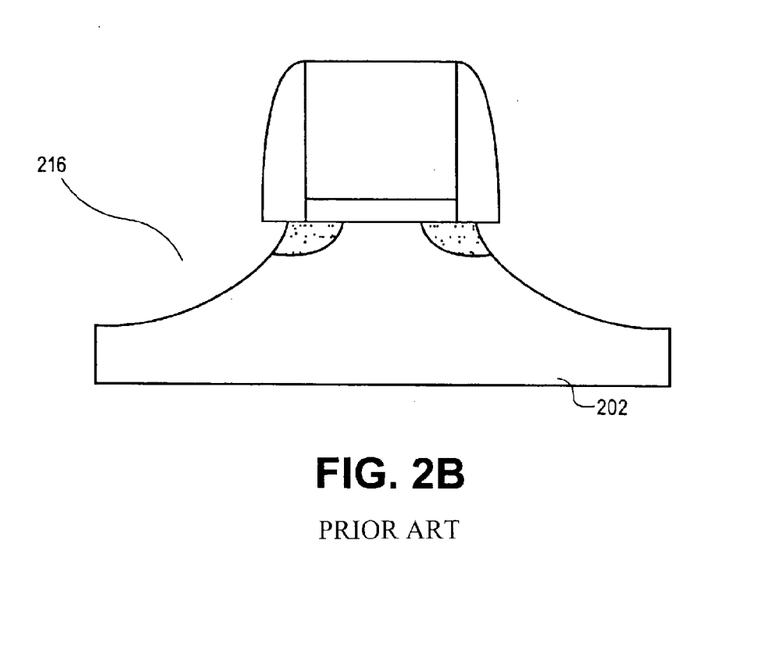
Figure 2C:
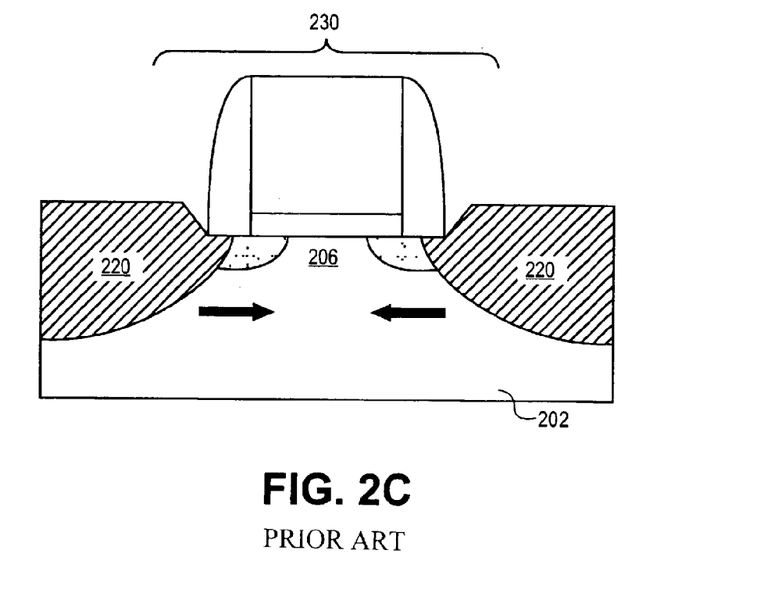

FIGS. 2A-C illustrate a typical process flow for forming strain-inducing silicon/germanium source/drain regions in a PMOS-FET. Referring to FIG. 2A, a non-strained PMOS-FET 200 is first formed. Non-strained PMOS-FET 200 is comprised of a channel region 206. A gate dielectric layer 204 sits above the channel region 206 and a gate electrode 208 sits above gate dielectric layer 204. Gate dielectric layer 204 and gate electrode 208 are isolated by gate isolation spacer 210. Tip extensions 212 and source/drain regions 214 are formed by implanting dopant atoms into substrate 202. Thus, the source/drain regions 214 are initially formed from the same material as the channel region 206. Therefore, the lattice mismatch between the source/drain regions 214 and the channel region 206 is negligible, resulting in effectively no strain on the channel region 206.

Referring to FIG. 2B, portions of substrate 202, including source/drain regions 214, are removed, e.g. by an etch process, to form recessed regions 216 in substrate 202. Subsequently, strain-inducing silicon/germanium source/drain regions 220 are formed by selectively growing an epitaxial film into recessed regions 216, as depicted in FIG. 2C. Strain-inducing silicon/germanium source/drain regions 220 can be doped with charge-carrier atoms, e.g. boron in the case of a PMOS-FET, which may be done in situ or after epitaxial film growth, or both. In an example, substrate 202, and hence channel region 206, is comprised of crystalline silicon and the film grown to form strain-inducing source/drain regions 220 is comprised of epitaxial silicon/germanium. The lattice constant of the epitaxial silicon/germanium film can be greater than that of crystalline silicon by a factor of ~1% (for 70% Si, 30% Ge) and so strain-inducing silicon/germanium source/drain regions 220 are comprised of a material with a larger lattice constant than that of the channel region 206. Therefore, a uniaxial compressive strain, depicted by the arrows in FIG. 2C, is rendered on channel region 206 in PMOS-FET 230, which can enhance hole mobility in the device.

In order to improve performance in N-type Metal Oxide Semiconductor Field-Effect Transistors (NMOS-FETs), a uniaxial tensile strain may be required to enhance electron mobility in the channel region. This may require the incorporation of strain-inducing source/drain regions with a smaller lattice constant than that of the channel region. For example, epitaxial carbon-doped silicon source/drain regions may be desirable for NMOS-FETs with a crystalline silicon channel region because the lattice constant of epitaxial carbon-doped silicon is smaller than that of crystalline silicon. However, selective deposition of an epitaxial carbon-doped silicon film can be difficult. Furthermore, subsequent incorporation of N-type dopants, e.g. phosphorus, into such an epitaxial carbon-doped silicon film may modify the film by displacing the lattice-incorporated carbon atoms. Such displacement of lattice-incorporated carbon atoms may reduce the lattice constant differential between the resulting source/drain regions and the channel region, effectively mitigating any performance-enhancing strain induced on the channel region.

Thus, a method to fabricate semiconductor devices comprising strain-inducing semiconductor regions is described herein.

DETAILED DESCRIPTION

A process for fabricating semiconductor devices and the resultant devices are described. In the following description, numerous specific details are set forth, such as specific dimensions and chemical regimes, in order to provide a thorough understanding of the present invention. It will be apparent to one skilled in the art that the present invention may be practiced without these specific details. In other instances, well-known processing steps, such as patterning steps or wet chemical cleans, are not described in detail in order to not unnecessarily obscure the present invention. Furthermore, it is understood that the various embodiments shown in the figures are illustrative representations and are not necessarily drawn to scale.

Disclosed herein is a method to form a strain-inducing semiconductor region. Formation of a strain-inducing semiconductor region laterally adjacent to a crystalline substrate may result in a uniaxial strain induced on the crystalline substrate, providing a strained crystalline substrate. For example, a MOS-FET may comprise a crystalline substrate and laterally adjacent strain-inducing source/drain regions. The laterally adjacent strain-inducing source/drain regions may impart a uniaxial strain to the crystalline substrate, forming a strained crystalline substrate in the MOS-FET. In the case where the crystalline substrate comprises a channel region, a strained channel region may thus be provided. A MOS-FET that comprises a strained channel region may exhibit an enhanced carrier mobility in the channel region when in an ON state.

A semiconductor region formed on or in a crystalline substrate may impart a strain to the crystalline substrate, and hence may be a strain-inducing semiconductor region, if the lattice constant of the semiconductor region is different from the lattice constant of the crystalline substrate. The lattice constants are based on the atomic spacings and the unit cell orientations within each of the semiconductor region and the crystalline substrate. Thus, a semiconductor region comprising different species of lattice-forming atoms than the crystalline substrate may impart a strain to the crystalline substrate. For example, in accordance with an embodiment of the present invention, a semiconductor region that comprises only silicon lattice-forming atoms may impart a strain to a crystalline substrate comprised of both silicon and germanium lattice-forming atoms. Furthermore, a semiconductor region comprising the same species of lattice-forming atoms as the crystalline substrate, but wherein the species of lattice-forming atoms are present in different stoichiometric concentrations, may impart a strain to the crystalline substrate. For example, in accordance with an embodiment of the present invention, a semiconductor region that comprises $Si_xGe_{1-x}$ lattice-forming atoms (where 0<x<1) may impart a strain to a crystalline substrate comprised of $Si_yGe_{1-y}$ lattice-forming atoms (where 0<y<1, and x≠y). Thus, combining the above examples, a semiconductor region with a crystalline lattice of one or more species of lattice-forming atoms may impart a strain to a crystalline substrate, wherein the lattice constant of the semiconductor region is different from that of the crystalline substrate, and wherein all species of lattice-forming atoms of the semiconductor region are contained in the crystalline substrate.

A strain-inducing semiconductor region formed in an etched-out portion of a crystalline substrate may impart a uniaxial strain to the crystalline substrate. In turn, the crystalline substrate may impart a uniaxial strain to the strain-inducing semiconductor region. For example, in accordance with an embodiment of the present invention, a MOS-FET device comprises strain-inducing source/drain regions formed in etched-out portions of a crystalline substrate. The strain-inducing source/drain regions may impart a uniaxial strain to the crystalline substrate, while the crystalline substrate imparts a uniaxial strain to the strain-inducing source/drain regions. In one embodiment, the lattice constant of the strain-inducing source/drain regions is smaller than the lattice constant of the crystalline substrate and the strain-inducing source/drain regions impart a tensile uniaxial strain to the crystalline substrate, while the crystalline substrate imparts a tensile strain to the strain-inducing source/drain regions. Thus, when the lattice constant of a strain-inducing source/drain region that fills an etched-out portion of a crystalline substrate is smaller than the lattice constant of the crystalline substrate, the lattice-forming atoms of the strain-inducing source/drain region are pulled apart (i.e. tensile strain) from their normal resting state and hence may induce a tensile strain on the crystalline substrate as they attempt to relax. In another embodiment, the lattice constant of the strain-inducing source/drain regions is larger than the lattice constant of the crystalline substrate and the strain-inducing source/drain regions impart a compressive uniaxial strain to the crystalline substrate, while the crystalline substrate imparts a compressive strain to the strain-inducing source/drain regions. Thus, when the lattice constant of a strain-inducing source/drain region that fills an etched-out portion of a crystalline substrate is larger than the lattice constant of the crystalline substrate, the lattice-forming atoms of the strain-inducing source/drain region are pushed together (i.e. compressive strain) from their normal resting state and hence may induce a compressive strain on the crystalline substrate as they attempt to relax. Therefore, either a compressive or tensile uniaxial strain may be imparted to a crystalline substrate by a strain-inducing semiconductor region.

Charge-carrier dopant impurity atoms (e.g. As dopant impurity atoms in a Si semiconductor region or Te dopant impurity atoms in a III-V semiconductor region) may have an effect on the lattice constant of the semiconductor region in which they are implanted. However, at typical concentrations of dopant impurity atoms, e.g. 1E15-5E21 atoms/$cm^3$, the modification of the lattice constant may be very small with respect to the amount of strain imparted by a strain-inducing semiconductor region to a crystalline substrate. The use of charge-neutral lattice-forming atoms (e.g. Ge in a Si film or Al in a GaAs film) in a strain-inducing semiconductor region may enable a greater variation of the lattice constant of a strain-inducing semiconductor region, and hence a greater amount of imparted strain to the crystalline substrate, without significantly impacting the electrical properties of the strain-inducing semiconductor region. For example, in accordance with an embodiment of the present invention, charge-neutral lattice-forming atoms are used to provide a strain-inducing semiconductor region with a lattice constant different from the lattice constant of a crystalline substrate by a factor of at least 0.1%. In another embodiment, charge-neutral lattice-forming atoms are used to provide a strain-inducing semiconductor region with a lattice constant different from the lattice constant of a crystalline substrate by a factor in the range of 0.5%-1.5%. Thus, a significant amount of the lattice-constant variation in a strain-inducing semiconductor region may be provided with the use of charge-neutral lattice-forming atoms.

Figure 3A:
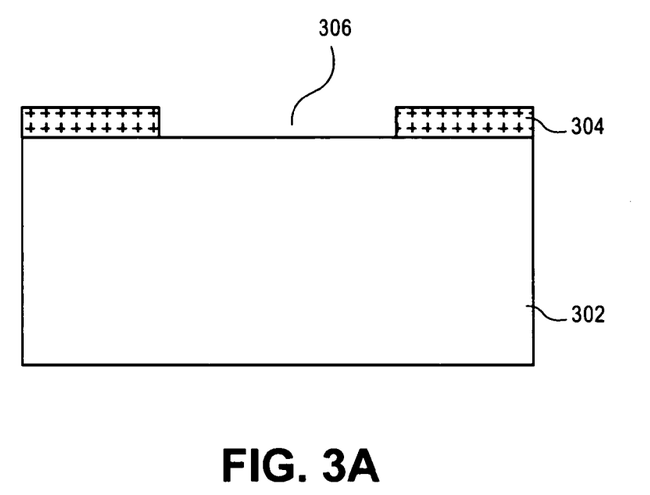
FIGS. 3A-D illustrate cross-sectional views representing the formation of a strain-inducing semiconductor region in an etched-out region of a crystalline substrate, in accordance with an embodiment of the present invention.

As an example of one embodiment of the present invention, FIGS. 3A-D illustrate cross-sectional views representing the formation of a strain-inducing semiconductor region in an etched-out region of a crystalline substrate. Referring to FIG. 3A, a crystalline substrate 302 may be masked by masking layer 304 with an opening 306. In one embodiment of the present invention, crystalline substrate 302 is a crystalline silicon/germanium substrate of the stoichiometry $Si_xGe_{1-x}$, where $0<x<1$. In another embodiment, crystalline substrate 302 is comprised of a III-V material selected from the group consisting of $Al_xGa_{1-x}As$, $In_xGa_{1-x}As$, $In_xGa_{1-x}P$ or $Al_xIn_{1-x}Sb$, where $0<x<1$.

Figure 3B:
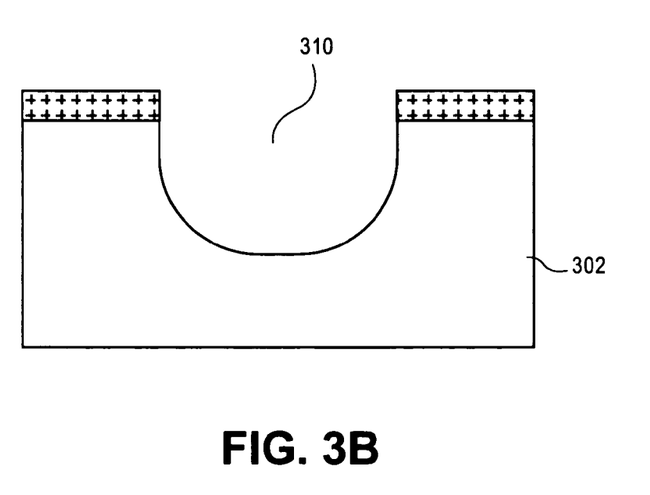
Figure 3C:
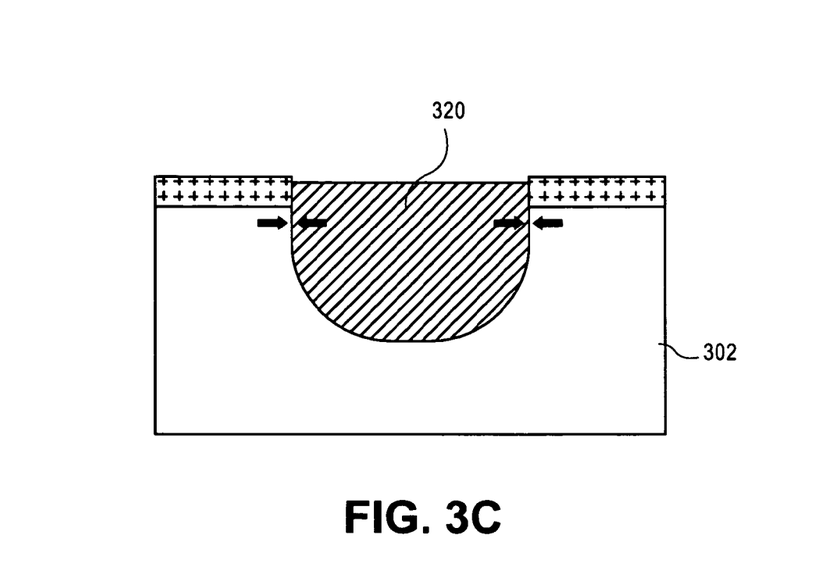
Figure 3D:
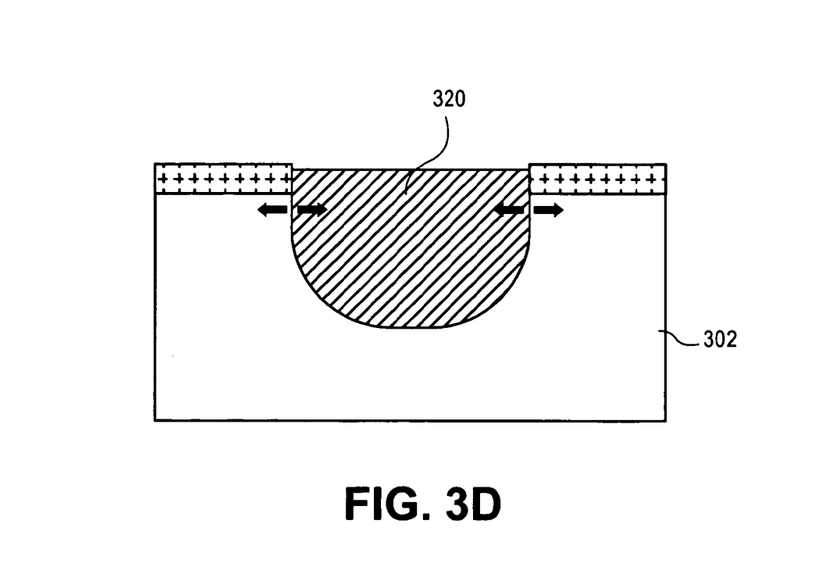

Referring to FIG. 3B, a region of crystalline substrate 302 may be removed to form etched-out region 310. A material region 320 may be formed in etched-out region 310 of crystalline substrate 302, as depicted in FIG. 3C. In accordance with an embodiment of the present invention, material region 320 is a strain-inducing semiconductor region that imparts a compressive uniaxial strain to crystalline substrate 302, as represented by the arrows in FIG. 3C. In another embodiment, material region 320 is a strain-inducing semiconductor region that imparts a tensile uniaxial strain to crystalline substrate 302, as represented by the arrows in FIG. 3D. In one embodiment, crystalline substrate 302 is comprised of $Si_xGe_{1-x}$ and material region 320 is comprised of $Si_yGe_{1-y}$, where $0<x<1$ and $x \neq y$. In an embodiment, $y=1$ or 0. In another embodiment, crystalline substrate 302 is comprised of $Al_xGa_{1-x}As$, $In_xGa_{1-x}As$, $In_xGa_{1-x}P$ or $Al_xIn_{1-x}Sb$ and material region 320 is comprised of $Al_yGa_{1-y}As$, $In_yGa_{1-y}As$, $In_yGa_{1-y}P$ or $Al_yIn_{1-y}Sb$, respectively, where $0<x<1$ and $x \neq y$. In an embodiment, $y=1$ or 0. In one embodiment of the present invention, the top surface of material region 320 is raised above the top surface of crystalline substrate 302, as depicted in FIGS. 3C and 3D.

A strain-inducing semiconductor region may be utilized in the fabrication of a semiconductor device. In one embodiment, the semiconductor device is a MOS-FET, a bipolar transistor, a memory transistor, a micro-electronic machine (MEM) or a diode. In another embodiment, the semiconductor device is a planar device or a non-planar device, such as a tri-gate or double-gate transistor. For illustrative purposes, the fabrication of a MOS-FET device incorporating a strain-inducing semiconductor region is described below.

Figure 4A:
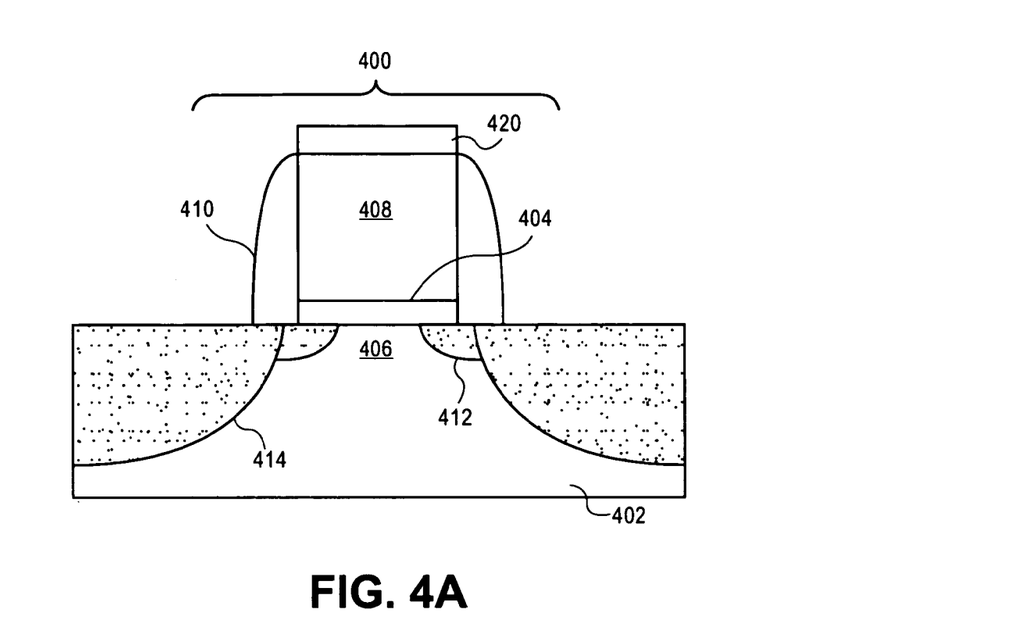
FIGS. 4A-D illustrate cross-sectional views representing the formation of strain-inducing source/drain regions in a MOS-FET device, in accordance with an embodiment of the present invention.

FIGS. 4A-D illustrate cross-sectional views representing the formation of strain-inducing source/drain regions in a MOS-FET device, in accordance with an embodiment of the present invention. Referring to FIG. 4A, a non-strained MOS-FET 400 is first formed. Non-strained MOS-FET 400 may be comprised of a channel region 406 in a crystalline substrate 402. In one embodiment, crystalline substrate 402 is a crystalline silicon/germanium substrate of the stoichiometry $Si_xGe_{1-x}$, where $0<x<1$. In another embodiment, crystalline substrate 402 is comprised of a III-V material selected from the group consisting of $Al_xGa_{1-x}As$, $In_xGa_{1-x}As$, $In_xGa_{1-x}P$ or $Al_xIn_{1-x}Sb$, where $0<x<1$. In one embodiment, crystalline substrate 402 is comprised of an epitaxial layer grown atop a distinct crystalline substrate. In another embodiment, crystalline substrate 402 comprises an insulating layer. In one embodiment, the insulating layer is comprised of silicon dioxide, silicon nitride, silicon oxy-nitride or a high-K dielectric layer. In an embodiment, crystalline substrate 402 is comprised of an epitaxial layer and a bulk crystal substrate with an insulating layer between the bulk crystal substrate and the epitaxial layer forming, for example, a silicon/germanium-on-insulator substrate.

A gate dielectric layer 404 may be formed above channel region 406. In one embodiment, gate dielectric layer 404 is formed by a thermal oxidation process and is comprised of silicon dioxide or silicon oxy-nitride. In another embodiment, gate dielectric layer 404 is formed by chemical vapor deposition or atomic layer deposition and is comprised of a high-k dielectric layer such as, but not limited to, hafnium oxide, zirconium oxide, hafnium silicate, hafnium oxy-nitride or lanthanum oxide.

A gate electrode 408 may be formed above gate dielectric layer 404. Gate electrode 408 may be formed by a subtractive etching process scheme or by a replacement gate process scheme. In one embodiment, gate electrode 408 is comprised of a polycrystalline silicon gate electrode, wherein the charge-carrier dopant impurities are implanted during fabrication of the tip and source/drain regions, described below. In another embodiment, gate electrode 408 is comprised of a metal layer such as but not limited to metal nitrides, metal carbides, hafnium, zirconium, titanium, tantalum, aluminum, ruthenium, palladium, platinum, cobalt, nickel or conductive metal oxides, e.g. ruthenium oxide. In one embodiment, a protective layer 420 is retained above gate electrode 408, as depicted in FIG. 4A.

A tip extension 412 may be formed by implanting charge-carrier dopant impurity atoms into crystalline substrate 402. Gate electrode 408 may act to mask a portion of crystalline substrate 402 to form self-aligned tip extensions 412. In one embodiment, crystalline substrate 402 is a crystalline silicon/germanium substrate of the stoichiometry $Si_xGe_{1-x}$, where $0<x<1$, and the charge-carrier dopant impurity atoms used to form tip extension 412 are selected from the group consisting of boron, arsenic, indium or phosphorus. In another embodiment, crystalline substrate 402 is comprised of $Al_xGa_{1-x}As$, $In_xGa_{1-x}As$, $In_xGa_{1-x}P$ or $Al_xIn_{1-x}Sb$, where $0<x<1$, and the charge-carrier dopant impurity atoms used to form tip extension 412 are selected from the group consisting of carbon, silicon, germanium, oxygen, sulfur, selenium or tellurium.

Gate dielectric layer 404 and gate electrode 408 may be isolated by gate isolation spacer 410. Gate isolation spacer 410 may be formed by any suitable technique that provides a dielectric barrier adjacent the sidewall of gate electrode 408. In an embodiment, an insulating layer such as but not limited to silicon dioxide, silicon nitride, silicon oxy-nitride or carbon-doped silicon nitride is deposited by a chemical vapor deposition process and is subsequently dry etched. In another embodiment, the thickness of the insulating layer is selected to determine the final width of gate isolation spacer 410. In one embodiment, gate isolation spacer 410 forms a hermetic seal with gate electrode 408 and the top surface of crystalline substrate 402 in order to encapsulate gate dielectric layer 404, as depicted in FIG. 4A.

A source/drain region 414 may be formed by implanting charge-carrier dopant impurity atoms into crystalline substrate 402. Gate isolation spacer 410 and gate electrode 408 may act to shield a portion of substrate 402 during the implant step to form self-aligned source/drain regions 414, as depicted in FIG. 4A. In effect, the thickness of gate isolation spacer 410 may play a role in dictating the dimensions of source/drain region 414. Source/drain region 414 may be formed using the same initial material as channel region 406. Therefore, the lattice mismatch between source/ drain region 414 and channel region 406 may be negligible, resulting in minimal effective strain imparted to channel region 406 of non-strained MOS-FET 400. In one embodiment, crystalline substrate 402 is a crystalline silicon/germanium substrate of the stoichiometry $Si_xGe_{1-x}$, where $0<x<1$, and the charge-carrier dopant impurity atoms used to form source/drain region 414 are selected from the group consisting of boron, arsenic, indium or phosphorus. In another embodiment, crystalline substrate 402 is comprised of $Al_xGa_{1-x}As$, $In_xGa_{1-x}As$, $In_xGa_{1-x}P$ or $Al_xIn_{1-x}Sb$, where $0<x<1$, and the charge-carrier dopant impurity atoms used to form source/drain region 414 are selected from the group consisting of carbon, silicon, germanium, oxygen, sulfur, selenium or tellurium.

Figure 4B:
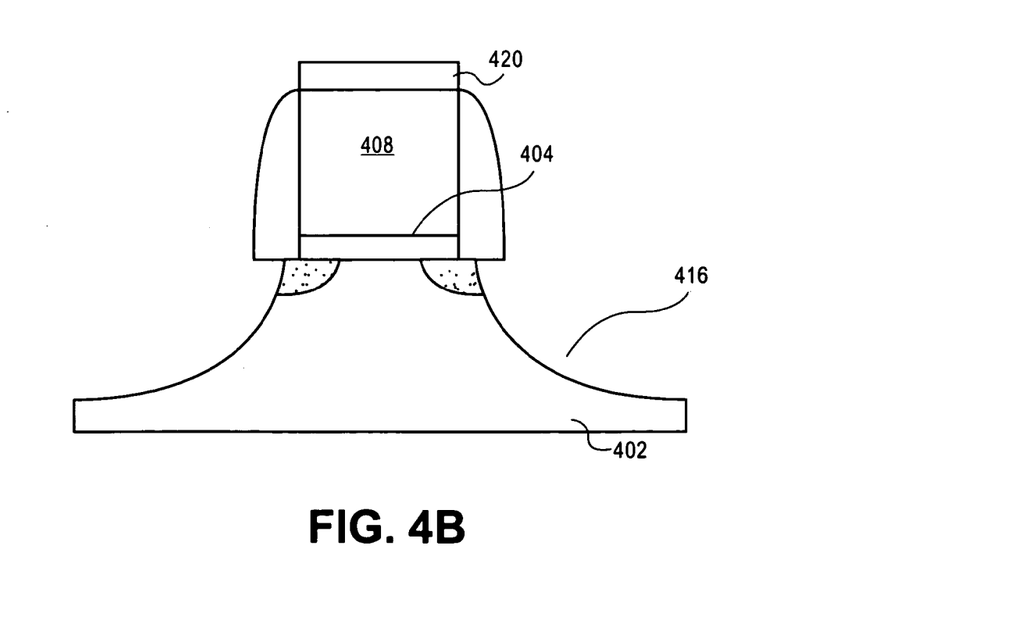

Referring to FIG. 4B, portions of crystalline substrate 402, including source/drain region 414, may be removed to form etched-out region 416 in substrate 402. Etched-out region 416 may be formed by any suitable technique that selectively removes a portion of crystalline substrate 402 without significantly impacting gate dielectric layer 404, gate electrode 408 or tip extension 412, such as a dry etch or a wet etch process. In one embodiment, etched-out region 416 is formed by a dry plasma etch using $NF_3$, HBr, $SF_6$/Cl or $Cl_2$ or a wet etch using $NH_4OH$ or tetramethylammonium hydroxide. In one embodiment, protective layer 420 protects gate electrode 408 during the formation of etched-out region 416. In another embodiment, etched-out region 416 is formed to a depth sufficient to remove the charge-carrier dopant impurities implanted to form source/drain region 414, as depicted in FIG. 4B.

Figure 4C:
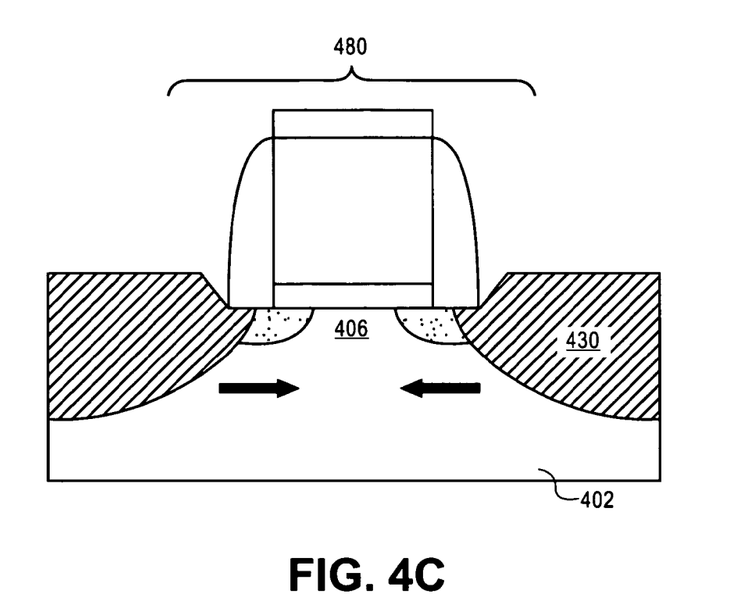
Figure 4D:
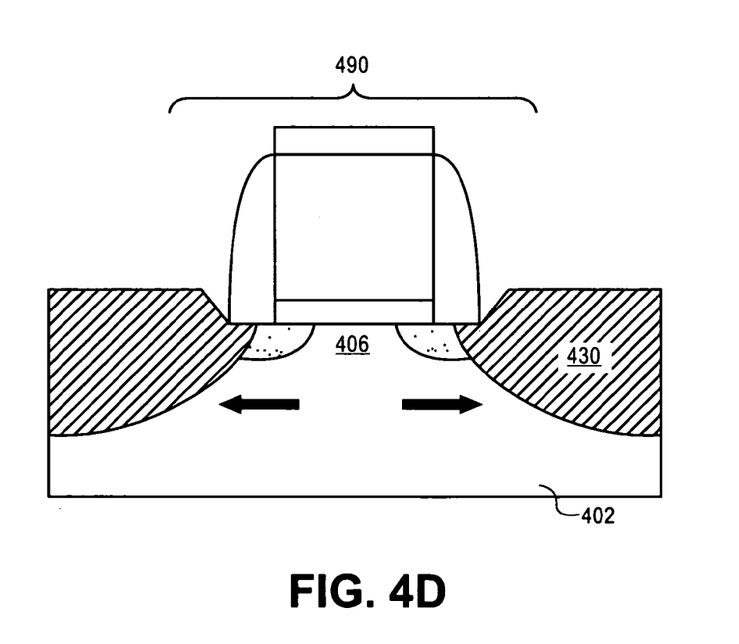

Referring to FIG. 4C, epitaxial source/drain region 430 may be formed selectively in etched-out region 416. In accordance with an embodiment of the present invention, epitaxial source/drain region 430 is a strain-inducing semiconductor region that imparts a compressive uniaxial strain to crystalline substrate 402, as represented by the arrows in FIG. 4C. In another embodiment, epitaxial source/drain region 430 is a strain-inducing semiconductor region that imparts a tensile uniaxial strain to crystalline substrate 402, as represented by the arrows in FIG. 4D. In one embodiment, crystalline substrate 402 is comprised of $Si_xGe_{1-x}$ and epitaxial source/drain region 430 is comprised of $Si_yGe_{1-y}$, where $0<x<1$ and $x\neq y$. In an embodiment, $y=1$ or 0. In one embodiment, crystalline substrate 402 is comprised of $Al_xGa_{1-x}As$, $In_xGa_{1-x}As$, $In_xGa_{1-x}P$ or $Al_xIn_{1-x}Sb$ and epitaxial source/drain region 430 is comprised of $Al_yGa_{1-y}As$, $In_yGa_{1-y}As$, $In_yGa_{1-y}P$ or $Al_yIn_{1-y}Sb$, respectively, where $0<x<1$ and $x\neq y$. In an embodiment, $y=1$ or 0. In one embodiment, the top surface of epitaxial source/drain region 430 is raised above the top surface of crystalline substrate 402, as depicted in FIGS. 4C and 4D.

In accordance with an embodiment of the present invention, charge-carrier dopant impurity atoms are implanted into epitaxial source/drain region 430 either during (i.e. in situ) or subsequent to formation of epitaxial source/drain region 430. In one embodiment, epitaxial source/drain region 430 is comprised of crystalline silicon and/or germanium of the stoichiometry $Si_yGe_{1-y}$, where $0<y<1$, and the charge-carrier dopant impurity atoms implanted are selected from the group consisting of boron, arsenic, indium or phosphorus. In another embodiment, epitaxial source/drain region 430 is comprised of $Al_yGa_{1-y}As$, $In_yGa_{1-y}As$, $In_yGa_{1-y}P$ or $Al_yIn_{1-y}Sb$, where $0<y<1$, and the charge-carrier dopant impurity atoms implanted are selected from the group consisting of carbon, silicon, germanium, oxygen, sulfur, selenium or tellurium.

Thus, a method to form a MOS-FET device comprising a strained crystalline substrate 402, and hence a strained channel region 406, and strain-inducing source/drain regions 430 has been described. In accordance with an embodiment of the present invention, strain-inducing source/drain region 430 imparts a uniaxial strain to strained crystalline substrate 402 and, in turn, strained crystalline substrate 402 imparts a uniaxial strain to strain-inducing source/drain region 430. In one embodiment, strain-inducing source/drain region 430 comprises one or more species of charge-neutral forming atoms and has a lattice constant different from the lattice constant of strained crystalline substrate 402, wherein all species of charge-neutral lattice-forming atoms contained in the strain-inducing source/drain region 430 are contained in strained crystalline substrate 402. For example, in accordance with an embodiment of the present invention, when epitaxial source/drain region 430 is comprised of silicon or $Si_yGe_{1-y}$, and crystalline substrate 402 is comprised of $Si_xGe_{1-x}$, where $0<x<1$, then all species of charge-neutral lattice-forming atoms contained in the strain-inducing source/drain region 430 (i.e. Si and/or Ge) are contained in strained crystalline substrate 402. In another example, in accordance with another embodiment of the present invention, when epitaxial source/drain region 430 is comprised of AlAs, GaAs or $Al_yGa_{1-y}As$ and crystalline substrate 402 is comprised of $Al_xGa_{1-x}As$, where $0<x<1$, then all species of charge-neutral lattice-forming atoms contained in the strain-inducing source/drain region 430 (i.e. Al and/or Ga, plus As) are contained in strained crystalline substrate 402.

In accordance with an embodiment of the present invention, the MOSFET device formed above is a PMOS-FET device 480 having a compressive-strained crystalline substrate 402, and hence a compressive-strained channel region 406, as depicted by the arrows in FIG. 4C. Thus, a PMOS-FET with enhanced hole mobility may be formed. In accordance with another embodiment of the present invention, the MOSFET device formed above is an NMOS-FET device 490 having a tensile-strained crystalline substrate 402, and hence a tensile-strained channel region 406, as depicted by the arrows in FIG. 4D. Thus, an NMOS-FET with enhanced electron mobility may be formed. PMOS-FET 480 or NMOS-FET 490 may subsequently be incorporated into an integrated circuit by conventional process steps, as known in the art.

Figure 5A:
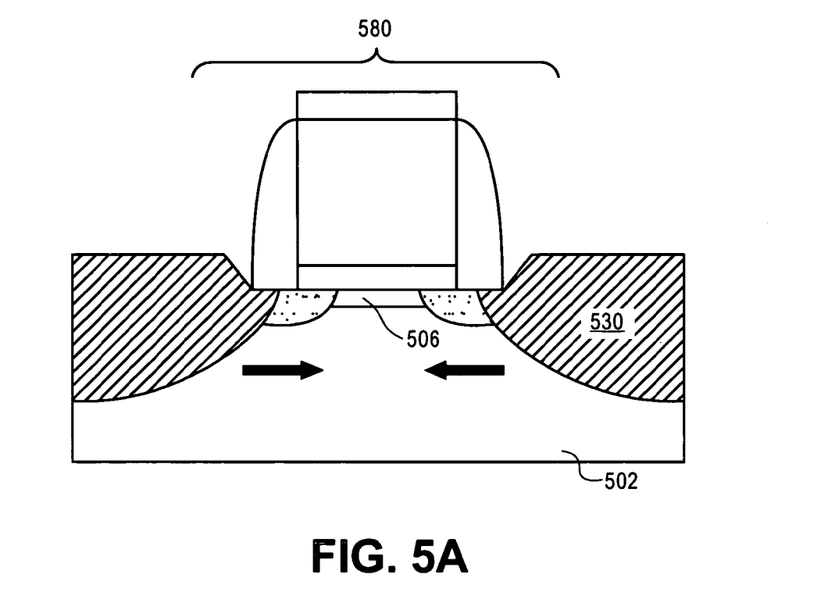
FIGS. 5A-B illustrate cross-sectional views representing MOS-FET devices comprising strain-inducing source/drain regions and a strained channel layer, in accordance with an embodiment of the present invention.
Figure 5B:
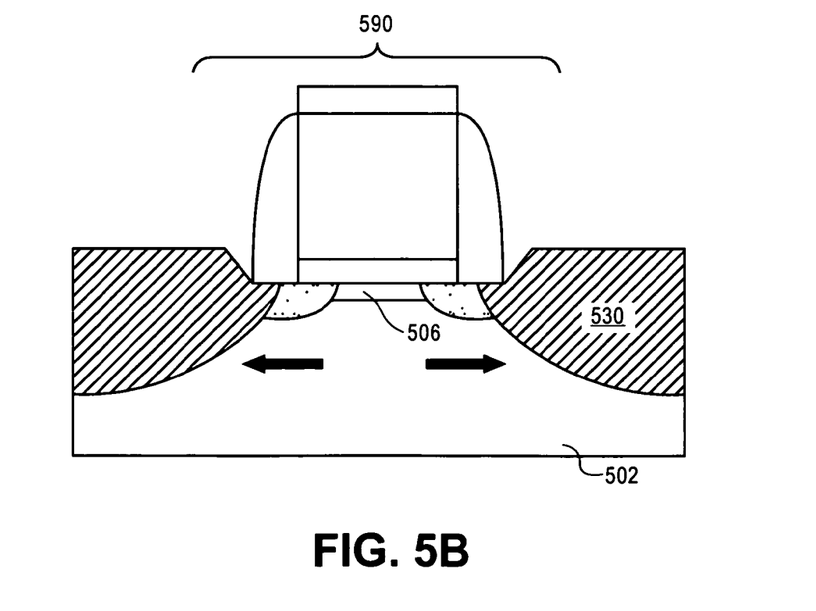

The present invention is not limited to the formation of semiconductor devices with channel regions contained in the crystalline substrate. In accordance with an embodiment of the present invention, a uniaxial strain is imparted to an epitaxial layer directly above a strained crystalline substrate, wherein the epitaxial layer comprises a channel region. Thus, a strain-inducing semiconductor region may be used to impart strain to a channel region in a layer distinct from the strained crystalline substrate. FIGS. 5A-B illustrate cross-sectional views representing MOS-FET devices comprising strain-inducing source/drain regions and a strained channel layer, in accordance with another embodiment of the present invention.

Referring to FIGS. 5A and 5B, a MOSFET may comprise a channel layer 506. Channel layer 506 may be comprised of any material suitable to allow charge carriers to migrate from a source region to a drain region when a MOS-FET or related device is in an ON state. In one embodiment, channel layer 506 comprises an epitaxial layer of silicon, germanium or silicon/germanium. In another embodiment, channel layer 506 comprises AlAs, GaAs, InAs, InP, GaP, AlSb, InSb, $Al_xGa_{1-x}As$, $In_xGa_{1-x}As$, $In_xGa_{1-x}P$ or $Al_xIn_{1-x}Sb$, where $0<x<1$.

Epitaxial source/drain region 530 may be formed selectively in an etched-out region of crystalline substrate 502. In accordance with an embodiment of the present invention, epitaxial source/drain region 530 is a strain-inducing semiconductor region that imparts a compressive uniaxial strain to crystalline substrate 502, and hence to channel layer 506, as represented by the arrows in FIG. 5A. In another embodiment, epitaxial source/drain region 530 is a strain-inducing semiconductor region that imparts a tensile uniaxial strain on crystalline substrate 502, and hence to channel layer 506, as represented by the arrows in FIG. 5B. In one embodiment, the top surface of epitaxial source/drain region 530 is raised above the top surface of crystalline substrate 502, as depicted in FIGS. 5A and 5B.

In accordance with an embodiment of the present invention, the MOSFET device formed above is a PMOS-FET device 580 having a compressive-strained crystalline substrate 502, and hence a compressive-strained channel layer 506, as depicted in FIG. 5A. Thus, a PMOS-FET comprising a channel layer with enhanced hole mobility may be formed. In accordance with another embodiment of the present invention, the MOSFET device formed above is an NMOS-FET device 590 having a tensile-strained crystalline substrate 502, and hence a tensile-strained channel region 506, as in FIG. 5B. Thus, an NMOS-FET comprising a channel layer with enhanced electron mobility may be formed. PMOS-FET 580 or NMOS-FET 590 may subsequently be incorporated into an integrated circuit by conventional process steps, as known in the art.

Figure 6A:
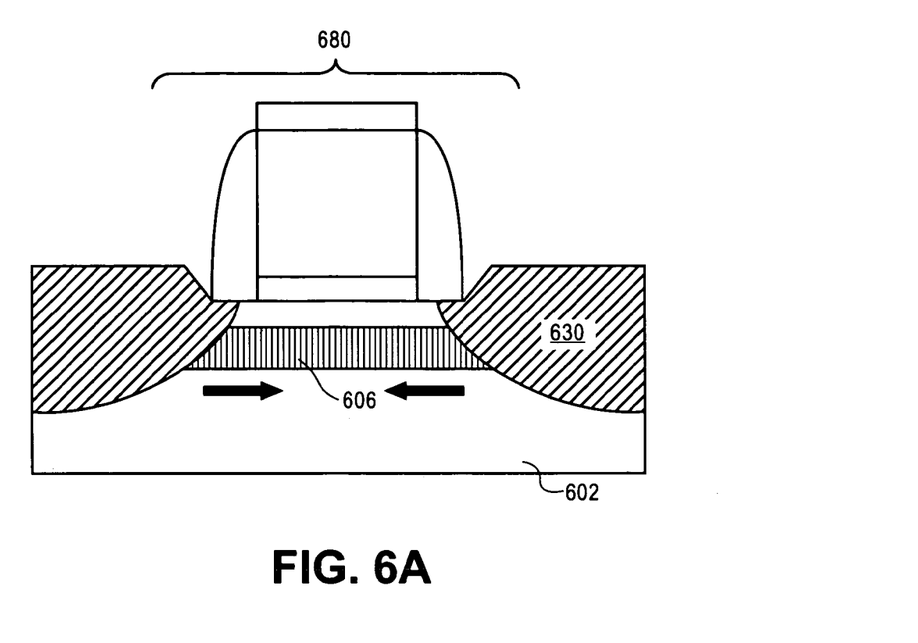
FIGS. 6A-B illustrate cross-sectional views representing MOS-FET devices comprising strain-inducing source/drain regions and a strained quantum well region, in accordance with an embodiment of the present invention.
Figure 6B:
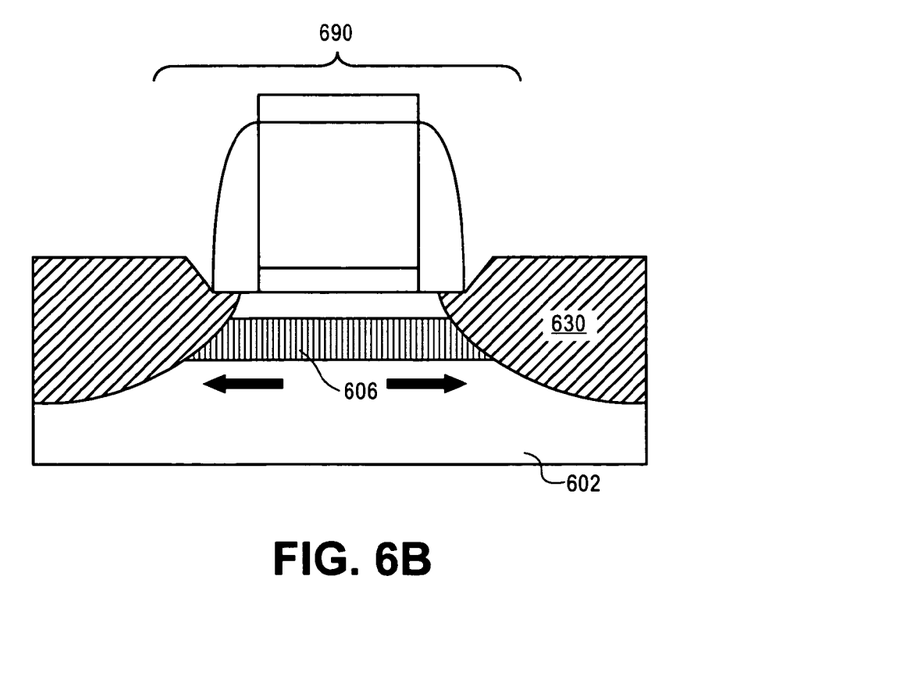

A strain-inducing semiconductor region may impart a strain to a region contained within a crystalline substrate. For example, in accordance with another embodiment of the present invention, a uniaxial strain is imparted to a quantum well region contained within a strained crystalline substrate, wherein the quantum well region acts as a channel region. FIGS. 6A-B illustrate cross-sectional views representing MOS-FET devices comprising strain-inducing source/drain regions and a strained quantum well region.

Referring to FIGS. 6A and 6B, a MOSFET may comprise a quantum well region 606. Quantum well region 606 may be comprised of any material suitable to allow charge carriers to migrate from a source region to a drain region when a MOS-FET or related device is in an ON state. In one embodiment, quantum well region 606 comprises silicon, germanium or silicon/germanium. In another embodiment, quantum well region 606 comprises AlAs, GaAs, InAs, InP, GaP, AlSb, InSb, $Al_xGa_{1-x}As$, $In_xGa_{1-x}As$, $In_xGa_{1-x}P$ or $Al_xIn_{1-x}Sb$, where $0<x<1$.

Epitaxial source/drain region 630 may be formed selectively in an etched-out region of crystalline substrate 602. In accordance with an embodiment of the present invention, epitaxial source/drain region 630 is a strain-inducing semiconductor region that imparts a compressive uniaxial strain to crystalline substrate 602, and hence to quantum well region 606, as represented by the arrows in FIG. 6A. In another embodiment, epitaxial source/drain region 630 is a strain-inducing semiconductor region that imparts a tensile uniaxial strain on crystalline substrate 602, and hence to quantum well region 606, as represented by the arrows in FIG. 6B. In one embodiment, the top surface of epitaxial source/drain region 630 is raised above the top surface of crystalline substrate 602, as depicted in FIGS. 6A and 6B.

In accordance with an embodiment of the present invention, the MOSFET device formed above is a PMOS-FET device 680 having a compressive-strained crystalline substrate 602, and hence a compressive-strained quantum well region 606, as depicted in FIG. 6A. Thus, a PMOS-FET comprising a quantum well region with enhanced hole mobility may be formed. In accordance with another embodiment of the present invention, the MOSFET device formed above is an NMOS-FET device 690 having a tensile-strained crystalline substrate 602, and hence a tensile-strained quantum well region 606, as depicted in FIG. 6B. Thus, an NMOS-FET comprising a quantum well region with enhanced electron mobility may be formed. PMOS-FET 680 or NMOS-FET 690 may subsequently be incorporated into an integrated circuit by conventional process steps, as known in the art.

The present invention is not limited to the formation of planar semiconductor devices. In accordance with an embodiment of the present invention, a uniaxial strain is imparted to the three-dimensional crystalline structure of a tri-gate MOS-FET device. Thus, a strain-inducing semiconductor region may be used to impart strain to a three-dimensional channel structure. FIGS. 7A-D illustrate cross-sectional views representing the formation of strain-inducing source/drain regions in a tri-gate MOS-FET device, in accordance with an embodiment of the present invention.

Figure 7A:
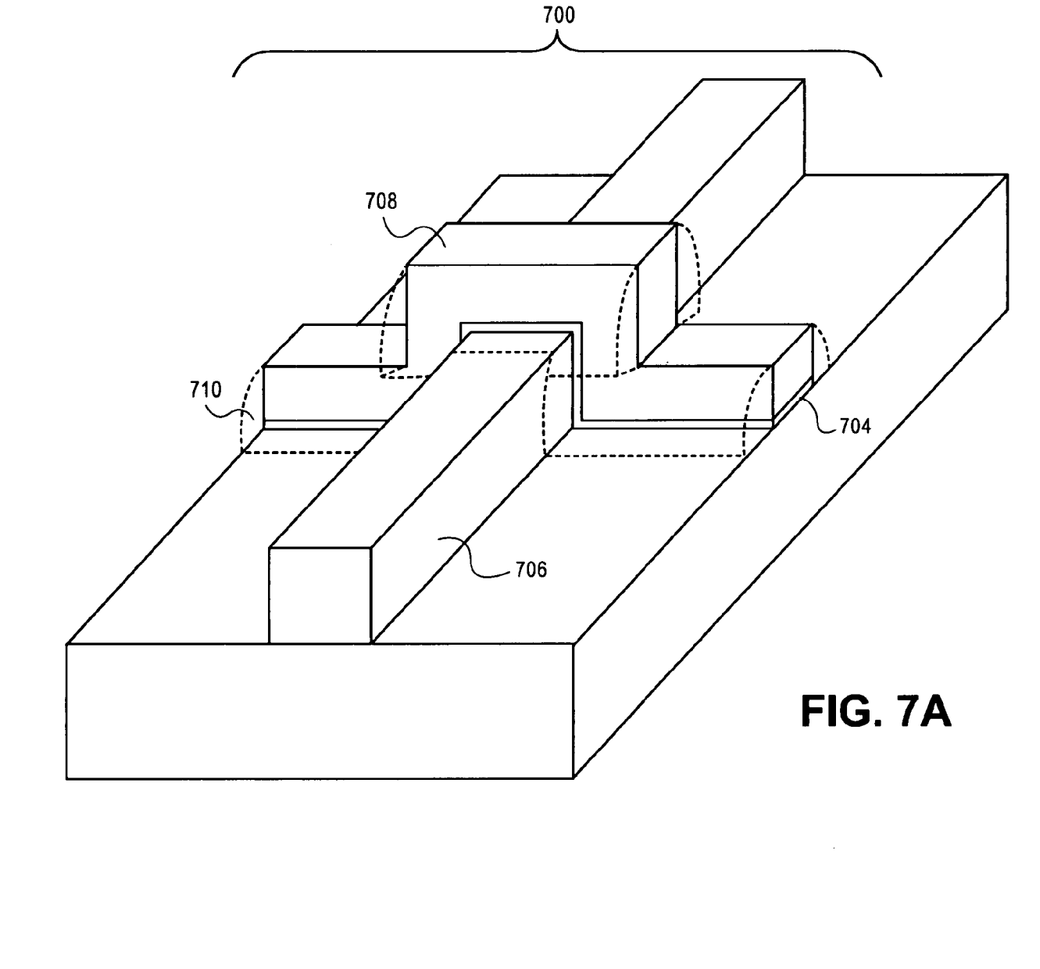
FIGS. 7A-D illustrate cross-sectional views representing the formation of three-dimensional strain-inducing epitaxial regions in a tri-gate MOS-FET device, in accordance with an embodiment of the present invention.

Referring to FIG. 7A, a non-strained tri-gate MOS-FET 700 is first formed. Non-strained tri-gate MOS-FET 700 may be comprised of a three-dimensional crystalline structure 706. In one embodiment of the present invention, three-dimensional crystalline structure 706 is comprised of silicon/germanium of the stoichiometry $Si_xGe_{1-x}$, where $0<x<1$. In another embodiment, three-dimensional crystalline structure 706 is comprised of a III-V material selected from the group consisting of $Al_xGa_{1-x}As$, $In_xGa_{1-x}As$, $In_xGa_{1-x}P$ or $Al_xIn_{1-x}Sb$, where $0<x<1$. In one embodiment, three-dimensional crystalline structure 706 is formed above a crystalline substrate. In another embodiment, three-dimensional crystalline structure 706 is formed above an insulating layer.

A gate dielectric layer 704 may be formed around three-dimensional crystalline structure 706, as depicted in FIG. 7A. In one embodiment, gate dielectric layer 704 is formed by a thermal oxidation process and is comprised of silicon dioxide or silicon oxy-nitride. In another embodiment, gate dielectric layer 704 is formed by chemical vapor deposition or atomic layer deposition and is comprised of a high-k dielectric layer such as, but not limited to, hafnium oxide, zirconium oxide, hafnium silicate, hafnium oxy-nitride or lanthanum oxide.

A gate electrode 708 may be formed above gate dielectric layer 704, as depicted in FIG. 7A. Gate electrode 708 may be formed by a subtractive etching process scheme or by a replacement gate process scheme. In one embodiment, gate electrode 708 is comprised of a polycrystalline silicon gate electrode. In another embodiment, gate electrode 708 is comprised of a metal layer such as but not limited to metal nitrides, metal carbides, hafnium, zirconium, titanium, tantalum, aluminum, ruthenium, palladium, platinum, cobalt, nickel or conductive metal oxides, e.g. ruthenium oxide. Gate dielectric layer 704 and gate electrode 708 may be isolated by gate isolation spacer 710.

Figure 7B:
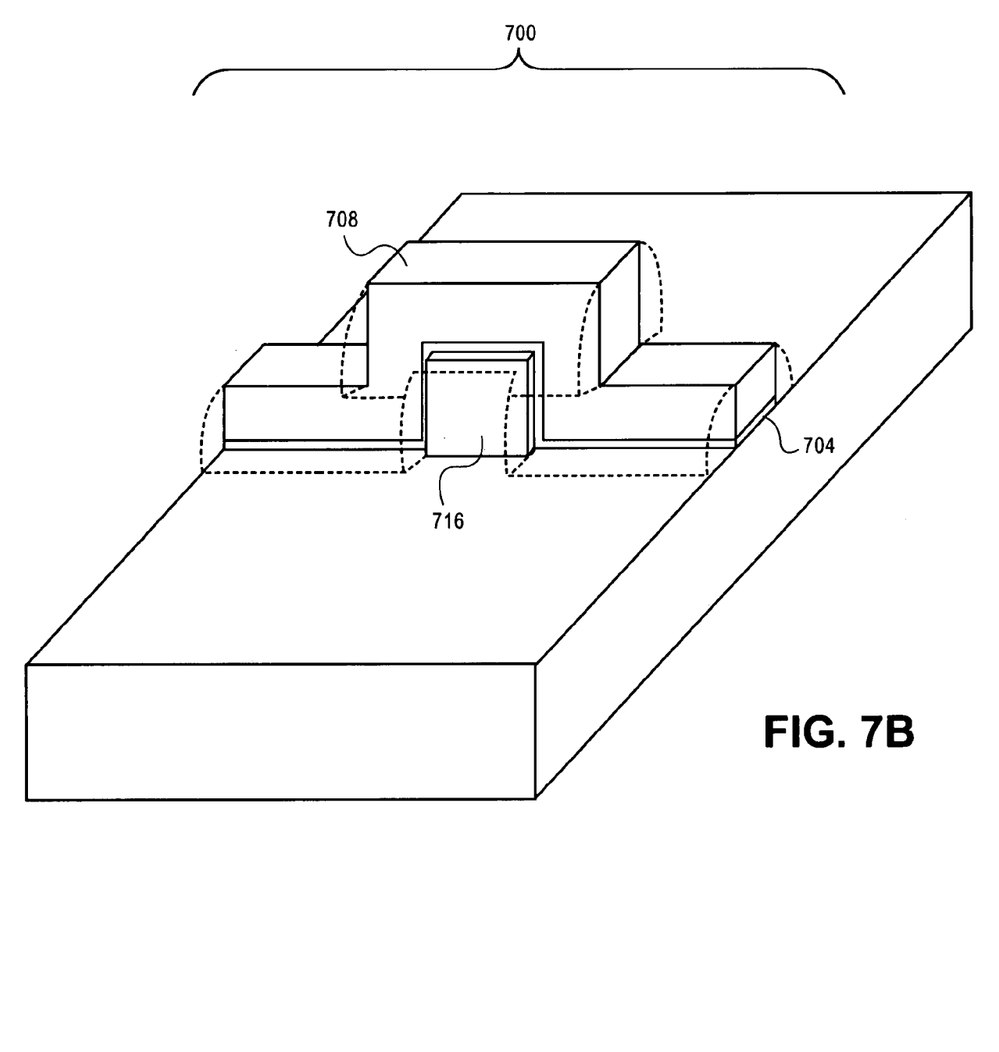

Referring to FIG. 7B, portions of three-dimensional crystalline structure 706 may be removed to form three-dimensional channel structure 716. Three-dimensional channel structure 716 may be formed by any suitable technique that selectively removes a portion of three-dimensional crystalline structure 706 without significantly impacting gate dielectric layer 704 or gate electrode 708, such as a dry etch or a wet etch process. In one embodiment, three-dimensional channel structure 716 is formed by a dry plasma etch using NF$_3$, HBr, SF$_6$/Cl or Cl$_2$ or a wet etch using NH$_4$OH or tetramethylammonium hydroxide.

Figure 7C:
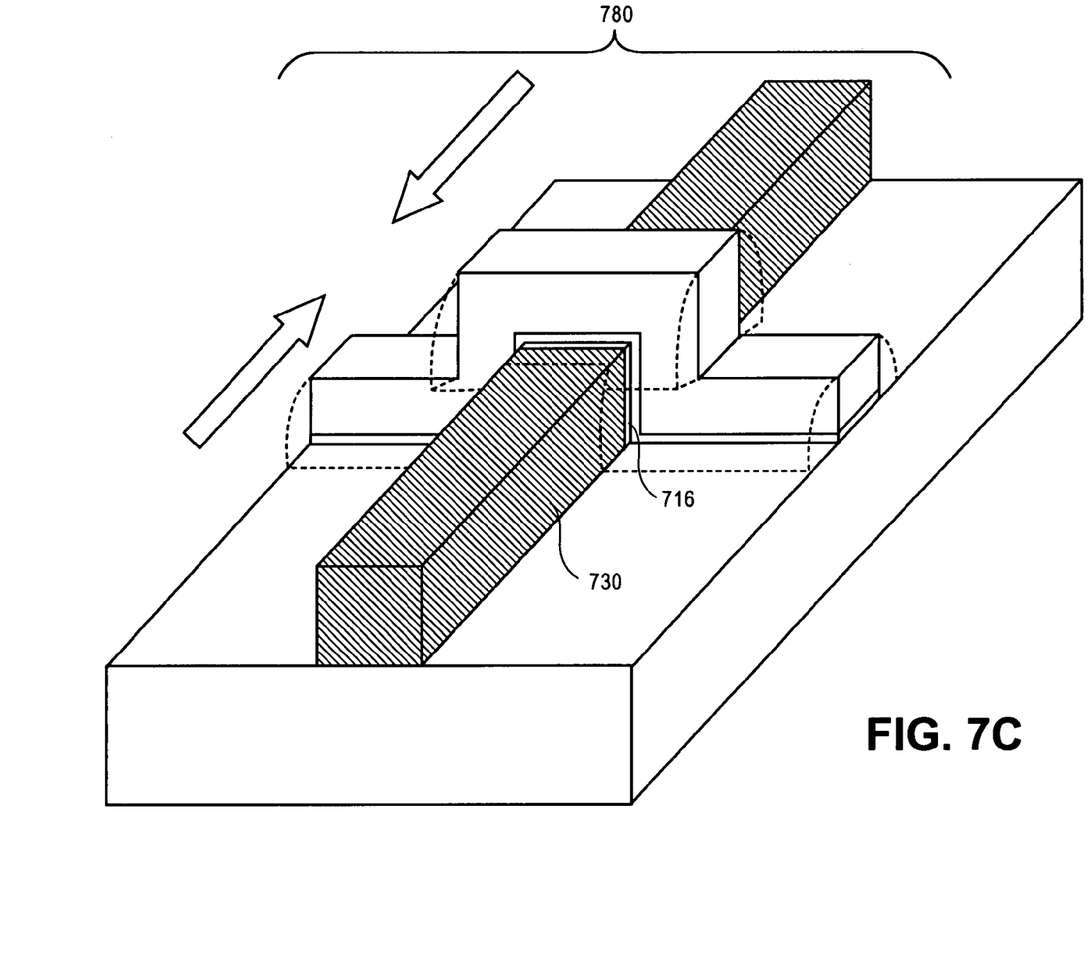

Referring to FIG. 7C, three-dimensional epitaxial region 730 may be formed selectively on three-dimensional channel structure 716. In accordance with an embodiment of the present invention, three-dimensional epitaxial region 730 is a strain-inducing semiconductor region that imparts a compressive uniaxial strain to three-dimensional channel structure 716, as represented by the arrows in FIG. 7C. In another embodiment, three-dimensional epitaxial region 730 is a strain-inducing semiconductor region that imparts a tensile uniaxial strain to three-dimensional channel structure 716, as represented by the arrows in FIG. 7D. In one embodiment, three-dimensional channel structure 716 is comprised of $Si_xGe_{1-x}$ and three-dimensional epitaxial region 730 is comprised of $Si_yGe_{1-y}$, where $0<x<1$ and $x \neq y$. In an embodiment, $y=1$ or $0$. In one embodiment, three-dimensional channel structure 716 is comprised of $Al_xGa_{1-x}As$, $In_xGa_{1-x}As$, $In_xGa_{1-x}P$ or $Al_xIn_{1-x}Sb$ and three-dimensional epitaxial region 730 is comprised of $Al_yGa_{1-y}As$, $In_yGa_{1-y}As$, $In_yGa_{1-y}P$ or $Al_yIn_{1-y}Sb$, respectively, where $0<x<1$ and $x \neq y$. In an embodiment, $y=1$ or $0$.

Figure 7D:
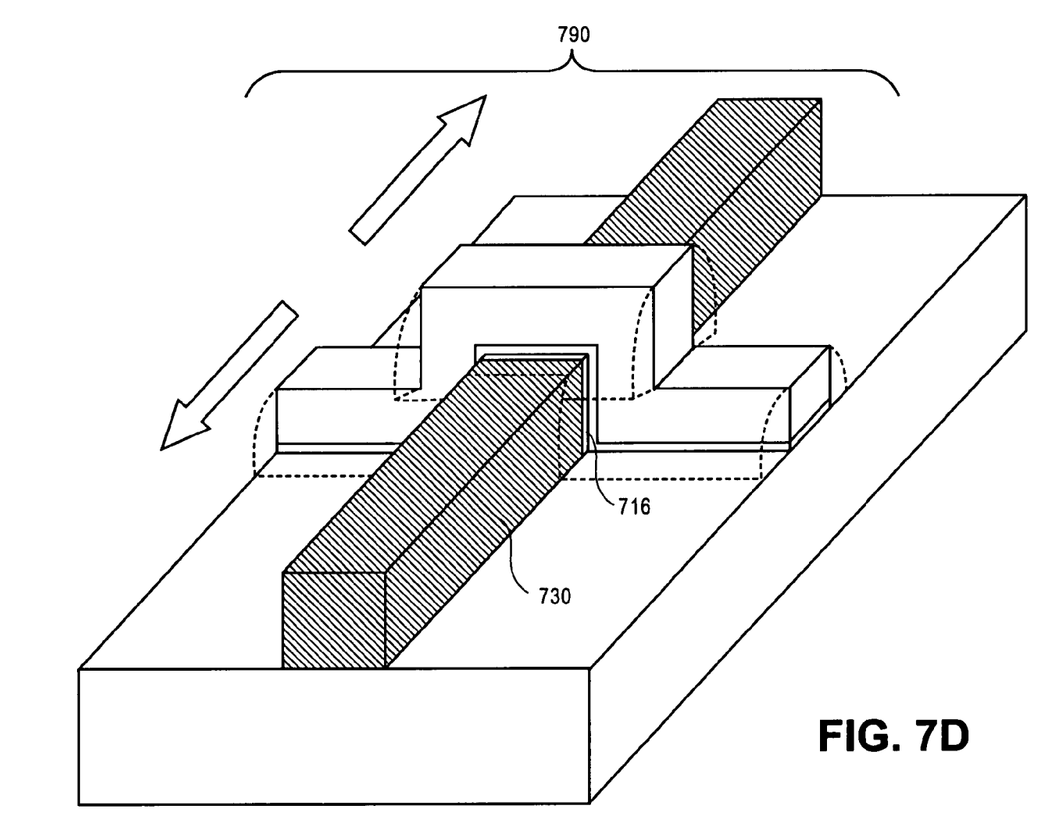

In accordance with an embodiment of the present invention, charge-carrier dopant impurity atoms are implanted into three-dimensional epitaxial region 730 either during (i.e. in situ) or subsequent to formation of three-dimensional epitaxial region 730. In one embodiment, three-dimensional epitaxial region 730 is comprised of crystalline silicon and/or germanium of the stoichiometry $Si_yGe_{1-y}$, where $0<y<1$, and the charge-carrier dopant impurity atoms implanted are selected from the group consisting of boron, arsenic, indium or phosphorus. In another embodiment, three-dimensional epitaxial region 730 is comprised of $Al_yGa_{1-y}As$, $In_yGa_{1-y}As$, $In_yGa_{1-y}P$ or $Al_yIn_{1-y}Sb$, where $0<y<1$, and the charge-carrier dopant impurity atoms implanted are selected from the group consisting of carbon, silicon, germanium, oxygen, sulfur, selenium or tellurium.

Thus, a method to form a tri-gate MOS-FET device comprising a strained three-dimensional channel structure 716 and a three-dimensional strain-inducing epitaxial region 730 has been described. In accordance with an embodiment of the present invention, three-dimensional strain-inducing epitaxial region 730 imparts a uniaxial strain to three-dimensional channel structure 716 and, in turn, strained three-dimensional channel structure 716 imparts a uniaxial strain to three-dimensional strain-inducing epitaxial region 730. In one embodiment, three-dimensional strain-inducing epitaxial region 730 comprises one or more species of charge-neutral forming atoms and has a lattice constant different from the lattice constant of strained three-dimensional channel structure 716, wherein all species of charge-neutral lattice-forming atoms contained in the three-dimensional strain-inducing epitaxial region 730 are contained in strained three-dimensional channel structure 716. In accordance with an embodiment of the present invention, the tri-gate MOSFET device formed above is a tri-gate PMOS-FET device 780 having a compressive-strained three-dimensional channel structure 716, as depicted by the arrows in FIG. 7C. Thus, a tri-gate PMOS-FET with enhanced hole mobility may be formed. In accordance with another embodiment of the present invention, the tri-gate MOSFET device formed above is a tri-gate NMOS-FET device 790 having a tensile-strained three-dimensional channel structure 716, as depicted by the arrows in FIG. 7D. Thus, a tri-gate NMOS-FET with enhanced electron mobility may be formed. Tri-gate PMOS-FET 780 or tri-gate NMOS-FET 790 may subsequently be incorporated into an integrated circuit by conventional process steps, as known in the art.

Thus, a method to form a strain-inducing semiconductor region has been disclosed. Formation of a strain-inducing semiconductor region laterally adjacent to a crystalline substrate may result in a uniaxial strain imparted to the crystalline substrate, providing a strained crystalline substrate. In accordance with an embodiment of the present invention, a semiconductor region with a crystalline lattice of one or more species of charge-neutral lattice-forming atoms imparts a strain to a crystalline substrate, wherein the lattice constant of the semiconductor region is different from that of the crystalline substrate, and wherein all species of charge-neutral lattice-forming atoms of the semiconductor region are contained in the crystalline substrate.

What is claimed is:

1. A semiconductor device, comprising:
   a crystalline substrate; and
   a transistor disposed above the substrate, the transistor comprising:
   a channel region comprising a $Si_xGe_{1-x}$ material, the channel region having a top surface and a pair of laterally opposing sidewalls;
   a gate dielectric layer formed on the top surface of the channel region and adjacent the pair of sidewalls of the channel region;
   a gate electrode formed on the gate dielectric layer;
   a pair of gate isolation spacers formed adjacent to the gate electrode;
   an epitaxially-grown source region disposed laterally and directly adjacent to a first end of the channel region, the source region having a top surface and a pair of laterally opposing sidewall surfaces; and
   an epitaxially-grown drain region disposed laterally and directly adjacent to a second end of the channel region, the drain region having a top surface and a pair of laterally opposing sidewall surfaces,
   wherein the source and drain regions comprise a $Si_yGe_{1-y}$ material directly adjacent to the channel region comprising the $Si_xGe_{1-x}$ material, $0<x<1$, and $y<x$.

2. The semiconductor device of claim 1, wherein the substrate further comprises germanium.

3. The semiconductor device of claim 1, wherein the channel region comprises a $Si_{0.5}Ge_{0.5}$ material.

4. The semiconductor device of claim 3, wherein the source and drain regions comprise a $Si_yGe_{1-y}$ material and $0<y<0.5$.

5. The semiconductor device of claim 1, wherein the epitaxially-grown source region and the epitaxially-grown drain region together impart a uniaxial strain to the channel region.

6. The semiconductor device of claim 5, wherein the uniaxial strain is a uniaxial compressive strain.

7. The semiconductor device of claim 1, wherein the semiconductor device is a P-type MOS-FET.

8. The semiconductor device of claim 1, wherein the epitaxially-grown source region and the epitaxially-grown drain region have a lattice constant that is greater than a lattice constant of the channel region by a factor of at least 0.1%.

9. The semiconductor device of claim 1, wherein gate electrode is a metal gate electrode, and wherein the gate dielectric layer is a high-K gate dielectric layer.

* * * * *